United States Patent [19]

Krishna

[11] 3,988,771
[45] Oct. 26, 1976

[54] SPATIAL CONTROL OF LIFETIME IN SEMICONDUCTOR DEVICE

[75] Inventor: Surinder Krishna, Ballston Lake, N.Y.

[73] Assignee: General Electric Company, Schenectady, N.Y.

[22] Filed: May 28, 1974

[21] Appl. No.: 474,035

[52] U.S. Cl. .................................. 357/64; 357/60; 357/37; 357/88
[51] Int. Cl.² ................ H01L 29/167; H01L 29/00; H01L 29/04
[58] Field of Search .................. 357/60, 64, 37, 88

[56] References Cited
UNITED STATES PATENTS

| | | |
|---|---|---|
| 2,813,048 | 11/1957 | Pfann .................................. 357/60 |
| 3,461,359 | 8/1969 | Raithel et al. ........................ 357/64 |
| 3,513,367 | 5/1970 | Wolley ................................. 357/64 |
| 3,727,116 | 4/1973 | Thomas et al. ....................... 357/64 |
| 3,775,196 | 11/1973 | Wakamiya et al. ................... 357/64 |

Primary Examiner—Edward J. Wojciechowicz
Attorney, Agent, or Firm—Donald M. Winegar; Joseph T. Cohen; Jerome C. Squillaro

[57] ABSTRACT

Deep level impurities such, for example, as gold, platinum, silver, nickel and copper, are introduced into selected regions of semiconductor devices by directional solidification to reduce the charge recombination lifetime and therefore the turn-off time of the device.

24 Claims, 9 Drawing Figures

SPATIAL CONTROL OF LIFETIME IN SEMICONDUCTOR DEVICE

BACKGROUND OF THE INVENTION

1. Field of the Invention

This invention relates to power semiconductor devices and, in particular, to the control of charge recombination lifetime and the turn-off of the same and methods of producing the controlling means.

2. Description of the Prior Art

To reduce turn-off time, and hence a loss in time of switching, in power semiconductor rectifiers and power semiconductor thyristors deep level impurities, such, for example, as gold, platinum, silver, copper and the like, are introduced into the rectifiers and thyristors. Prior art manufacturing procedures embody single or double diffusion process techniques to accomplish the desired end results. However, diffusion processing is not discretionary and therefore the deep level impurities are introduced substantially everywhere into the semiconductor material comprising the rectifier or thyristor. Consequently, the power rectifiers and power thyristors have excessive leakage currents which detrimentally effect the voltage ratings and the temperature ratings of the same. Additionally, the introduction of the deep level impurities into the suitably doped semiconductor material has the tendency to cause the precipitation of the deep level impurity metal at the boundaries of some suitably doped regions, such for example, as phosphorus doped regions and to cause depletion in other suitably doped regions, such for example, as boron doped regions. Such precipitates cause excess leakage to occur at the boundaries.

Therefore, it is an object of this invention to provide new and improved semiconductor devices, such, for example, as power rectifiers and power thyristors which overcome the deficiencies of prior art semiconductor devices.

Another object of this invention is to provide a new and improved semiconductor device having deep level impurities in only selected regions of the devices.

Another object of this invention is to provide a new and improved semiconductor device having directionally solidified regions of semiconductor material including deep level impurities therein.

A further object of this invention is to provide a new and improved process for introducing recombination sites in selected regions of a semiconductor device.

Other objects of this invention will, in part, be obvious and will, in part, appear hereinafter.

BRIEF DESCRIPTION OF THE INVENTION

In accordance with the teachings of this invention, there is provided a new and improved semiconductor device comprising a body of semiconductor material having two major opposed surfaces. The two major opposed surfaces are respectively the top and bottom surfaces of the body. The body has at least two abutting regions of opposite type conductivity. One of the regions has a surface coextensive with the top surface and another of the regions has a surface coextensive with the bottom surface of the body. A P-N junction is formed by the abutting surfaces of each pair of regions of opposite type conductivity. Each P-N junction has a portion thereof which is substantially parallel to both the top and bottom surfaces. At least one directionally solidified region of recrystallized semiconductor material of the body is formed in the body and extends into the body a predetermined distance from one of the two major opposed surfaces. The material of the directionally solidified region is doped with a deep level impurity such, for example, as gold, platinum, silver, copper, and the like, to provide recombination centers for free carriers within the body. The recrystallized region may extend entirely through the body, across all P-N junctions or across only selected ones of the P-N junctions present.

Preferably, a temperature gradient zone melting process is practiced for making the one or more directionally solidified regions. The material of the one or more regions so produced is recrystallized semiconductor material of the body having solid solubility of the deep level impurity therein.

DESCRIPTION OF THE INVENTION

Figure 1:
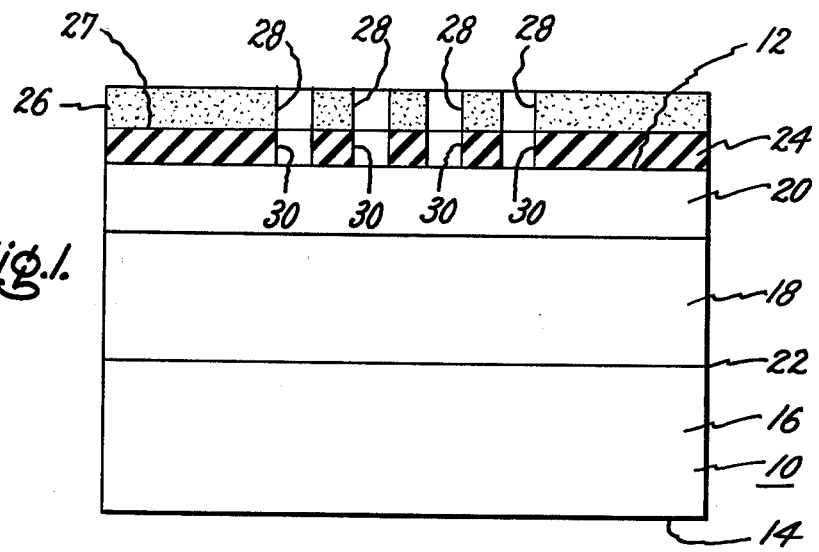
FIGS. 1 through 5 are elevation views, in cross-section, of a body of single crystal semiconductor material being processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element and a compound of a Group III element and a Group V element. The body 10 is processed in accordance with well known techniques of the prior art such, for example, as epitaxial growth, diffusion, combinations of diffusion and exitaxial growth, to produce power rectifiers, power thyristors, with or without shorted emitters, power bilateral switches and the like. The fabrication of such power devices is not a part of this invention since it is well known to those skilled in the art. In order to describe this invention more fully, the body 10 of semiconductor material will be to be of silicon and processed in accordance with the prior art techniques to produce a power device such, for example, as a power rectifier comprising a first region 16 of p-type conductivity, a second region 18 of n-type conductivity and a third region 20 of $n^+$ conductivity. A P-N junction 22 is formed by the abutting surfaces of the regions 16 and 18 of opposite type conductivity.

Upon completion of the fabrication of the regions of various type conductivity of the power device, the body 10 is mechanically polished, chemically etched to remove any damaged surfaces, rinsed in deionized water and dried in air. An acid resistant mask 24 is disposed on the surface of the body 10. Preferably, the mask 24 is of silicon oxide which is either thermally grown or vapor deposited on the surface by any of the methods well known to those skilled in the art. Employing well known photolithographical techniques a layer 26 of a photoresist material, such for example, as Kodak Metal Etch Resist, is disposed on the surface 27 of the silicon oxide layer 26. The material of the layer 26 is dried by baking at a temperature of about 80° C.

A suitable mask defining one or more geometrical shapes, such, for example, as an array of dots, an array of concentric circles, or an array of concentric shapes is disposed on the layer 26 of photoresist and exposed to ultraviolet light. After exposure, the layer 26 of photoresist is washed in Xylene to open windows 28 in the mask 26 so as to be able to selectively etch the silicon oxide layer 24 to expose selected surface areas of the surface 12 of the body 10 within windows 30 of the oxide layer 24.

Preferably, the preferred geometrical design is the array of dots which is preferentially limited to the central region of the power rectifier. In order to maximize the efficiency of the deep level traps within the device, it is desirous that the size of each directionally solidified region of minority carrier control impurity metal have the smallest possible cross-sectional area in order to maximize the unit member of such regions within a unit dimension of the device. Each region comprises recrystallized semiconductor material of the body 10 having solid solubility of at least one deep level impurity metal therein. It has been found that each dot should be preferably ten micrometers or less in diameter and 15 micrometers or less in center-to-center spacing from each other. Such an arrangement meets the desirous requirement that the regions be no more than one diffusion length apart from each other.

I define a diffusion length as follows:

Diffusion length is the average distance to which minority carriers diffuse between generation and recombination. It is also that distance which a minority carrier is likely to travel before recombination occurs when the carrier concentration is low. When high carrier injection levels are encountered, the diffusion length for the ambipolar or two carriers which are present is that distance which the two carriers are likely to travel before recombination occurs. Such an arrangement as described hereinbefore also provides an outer disk of the rectifier which is about 1 diffusion length or more to the edge which is kept free from the deep level traps. Thus the surface and bulk leakages at the P-N junction 22 edge will not be increased by such a process practiced herein. As a result of these preferred embodiments, the power rectifier has higher voltage and higher temperature ratings for fast switching power device which is superior to those made by prior art techniques. In thyristors regions of the gate and amplifying gate may or may not have recombination sites introduced depending on the performance requirements and design trade offs.

Selective etching of the layer 24 of silicon oxide is accomplished with a buffered hydrofluoric acid solution ($NH_4F$-HF). The etching is continued until the second set of windows 30 corresponding to the windows 28 of the photoresist mask 26 are opened in the layer 24 of silicon oxide to expose selected portions of the surface 12 of the body 10. The processed body 10 is rinsed in deionized water and dried. The remainder of the photoresist mask 16 is removed by immersion and concentrated sulfuric acid at 180° C or by immersion in a solution of one part of hydrogen peroxide and 1 part of concentrated sulfuric acid immediately after mixing.

Figure 2:
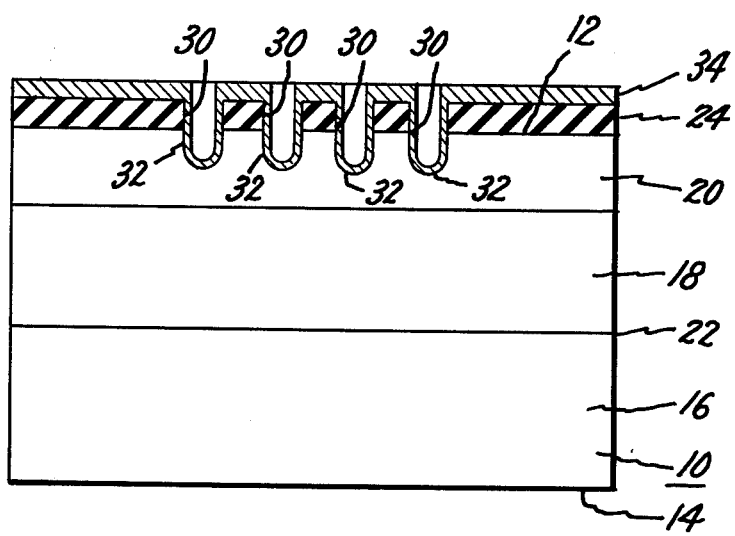

Referring now to FIG. 2, selective etching of the exposed surface areas of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature from 20° C to 30° C the mixed acid solution selectively etches silicon of the body 10 at a rate of approximately 5 microns per minute. A depression 32 is etched in the surface of the body beneath each window 30 of the oxide layer 24. The selective etching is continued until the depth of the depression 32 is enough to introduce a sufficient amount of the metal to allow a uniform cross-section of the migrated regions. Etching for approximately 5 minutes at a temperature of 25° C will result in a depression 32 of from 25 to 30 microns in depth for a window 30. The etched body 10 is rinsed in distilled water and blown dry. Preferably, a gas such, for example, as freon, argon, and the like, is suitable for drying the processed body 10.

The processed body 10 is disposed in a metal evaporation chamber. A layer 34 of a deep level impurity metal such for example, as gold, platinum, silver and the like, is formed on selective surface areas of the surface 12 by depositing the metal layer 34 on the remaining portions of the layer 24 of silicon oxide and on the exposed silicon in the depressions 32. The deep level impurity metal in the depressions 32 are the metal droplets to be thermal migrated through the body 10 of the power device to provide the desired spatial control of lifetime in the power device. The metal of the layer 34 may also comprise a material such for example, as tin if one wishes to limit the concentration of the deep level impurity metal to be left within the device to provide the spatial control of the lifetime. The thickness of the layer 34 is approximately equal to the depth of the depressions 32 which is preferably in this instance 10 microns in thickness. Prior to migrating the metal droplet or droplets in the depressions 32 through the body 10 of silicon the excess metal of the layer 34 is removed from the silicon oxide layer by such suitable means as grinding away the excess metal with a 600 grit carbide paper or by selective chemical etching.

It has been discovered that the vapor deposition of the layer of deep level impurity metal should be performed at a pressure of approximatelly $5 \times 10^{-5}$ torr. When the pressure is greater than $5 \times 10^{-5}$ torr, we have found that in the case of metal deposited in the depressions 32, the metal does not penetrate into the silicon and migrate through the body. It is believed that a thin oxide layer is formed on the silicon material which prevents good wetting of the contiguous surfaces of the metal layer in the silicon. The initial melt of the deep level impurity metal and silicon required for thermal migration is not obtained because the inability of gold atoms and the like to diffuse into the silicon interface. In a like manner any deep level impurity metal deposited by sputtering is not desirable as the deposited metal appears to be saturated with oxygen from the process. The preferred method of depositing the deep level impurity metal on the silicon body is by the electron beam method and the like wherein little, if any, oxygen can be trapped in the deposited metal.

Figure 3:
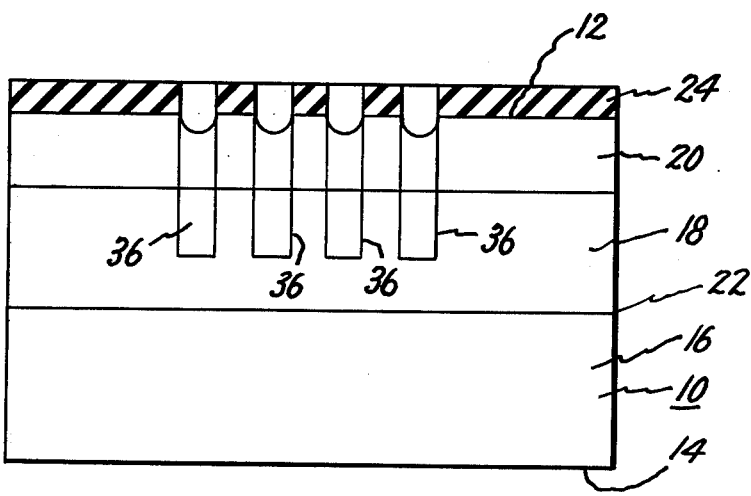

Referring now to FIG. 3, the processed body 10 is placed in a thermal migration apparatus, not shown, and the metal droplets in the depressions 32 are migrated a predetermined distance into the body 10 by a temperature gradient zone melting process to form regions 36 of recrystallized material of the body 10 having solid solubility of at least the deep level impurity metal therein. A thermal gradient of approximately 50° C per centimeter between the bottom surface 14 which is the hot face and the top surface 12 which is the cold face has been discovered to be appropriate for an average temperature of the body 10 from 400° C to 1350° C. The process is practiced for a sufficient length of time to migrate the metal droplets the desired predetermined distance into the body 10. For example, when each of the metal droplets is approximately 20 microns in thickness, a thermal gradient of 50° C per centimeter, a temperature of the body 10 of 450° C, a furnace time of about less than 24 hours is required to migrate the droplets through a silicon body of approximately 1 millimeter thickness should such a configuration be desired.

Upon reaching a predetermined distance into the body 10 from surface 12, the thermal gradient is reversed. The metal droplets are then migrated substantially along the same migration or crystallographic axis to reach surface 12. The excess metal is removed by grinding or by selective chemical etching.

The resulting structure is desirable in that the deep level impurity affects the injection efficiency of the P–N junction 22. Therefore when the regions 36 are terminated a predetermined distance from the P–N junction 22, the resulting power rectifier has excellent injection efficiency from the P–N junction. At the same time, the leakage of current at the P–N junction for high temperature blocking is minimized. The resulting device has excellent turn-off times and high temperature blocking capabilities during device operation.

The metal droplet should not be allowed to solidify within the body 10. Solidification of the droplet within the body 10 may cause severe internal stresses and even fractures of the materials which detrimentally affects the physical characteristics of the body 10. Complete failure of the process body 10 is also possible.

It has been discovered that when the body 10 is of silicon, germanium, silicon carbide, gallium arsenide semiconductor material and the like, the migrating metal droplet has a preferred shape which also gives rise to each resulting recrystallized region 36 being of the same cross-sectional shape as the migrating droplet. In a crystal axis direction of < 111 > of thermal migration the droplet migrates as a triangular platelet laying in a (111) plane. The platelet is bounded on its edges by (11$\bar{2}$) planes. A droplet larger than 0.10 centimeter on an edge is unstable and breaks up into several droplets during migration. A droplet smaller than 0.0010 centimeter may not migrate into the body 10 because of a surface barrier problem.

The ratio of the droplet migration rate over the imposed thermal gradient is a function of the temperature at which the migration of the droplet is practiced. At high temperatures of the order of 1050° C to 1400° C droplet migration velocity increases rapidly with increasing temperature. A velocity of 10 centimeters per day or $1.2 \times 10^{-4}$ centimeter per second is obtainable for such metal droplets which comprise aluminum and silicon.

The droplet migration rate is also affected by the droplet volume. The droplet migration rate decreases with a decrease in the droplet volume.

A droplet migrates in the < 100 > crystal axis direction as a pyramid bounded by four forward (111) planes and a rear (100) plane. Careful control of the thermal gradient and migration rate is a necessity. Otherwise, the region 36 may be deposited with twists and kinks therein. It appears that there is a non-uniform dissolution of the four forward (111) facets in that they do not always dissolve at the uniform rate. Non-uniform dissolution of the four forward (111) facets may cause the regular pyramidal shape of the droplet to become distorted into a trapazoidal shape.

It has also been discovered that the thermal migration of droplets may be practiced in an inert gas atmosphere at a positive pressure wherein the body of semiconductor material is a thin wafer of the order of 10 mil thickness.

Figure 4:
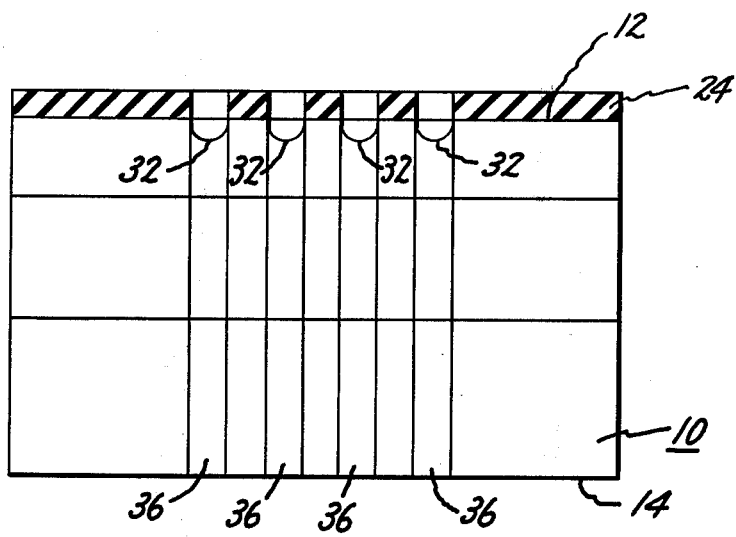

Alternately, as shown in FIG. 4, the droplets may be migrated through the entire body 10 to produce power rectifiers wherein operating characteristics less demanding than that of the device of FIG. 3 may be tolerated.

For a more thorough understanding of the temperature gradient zone melting process employed in this invention and for a more thorough description of the apparatus employed for the process, one is directed to the copending application of Thomas R. Anthony and Harvey E. Cline assigned to the same assignee as this invention and entitled "Method of Making Deep Diode Devices," Ser. No. 411,015, and now U.S. Pat. No. 3,901,736, "Deep Diode Device Production and Method," Ser. No. 411,021, "Deep Diode Devices and Methods and Apparatus," Ser. No. 411,001, now abandoned in favor of Ser. No. 552,154 "High Velocity Thermomigration Method of Making Deep Diodes," Ser. No. 411,015, and now U.S. Pat. No. 3,898,106, "Deep Diode Device Having Dislocation-Free P-N Junctions and Method," Ser. No. 411,009, and now U.S. Pat. No. 3,902,925 and "The Stabilized Droplet Method of Making Deep Diodes Having Uniform Electrical Properties," Ser. No. 411,008 and now U.S. Pat. No. 3,899,361.

Upon completion of the temperature gradient zone melting process the metal droplets which have migrated either part way into or through the entire body 10 onto the respective surfaces 12 and 14 are removed by selective etching or grinding. The migration of the metal droplet in the depression 32 of the body produces a body 10 with an array of columnar regions 36 of recrystallized semiconductor material of the body 10 containing dissolved metals of which the droplet was composed. Each region 36 has a substantially constant uniform concentration level of the respective impurity metals throughout the entire directionally solidified columnar region 36. Some variation of the concentration does occur because of the nature of the process practiced and the change in the composition of the materials is readily seen from the associated phase diagrams of the materials involved. However, the variation is ever so slight and inconsequential. The width of the regions 36 is substantially constant for the entire length. The respective end surfaces of the regions 36 are coextensive with the respective top and the bottom surfaces 12 and 14 of the body 10. The remaining material of the body 10 encircles the regions 36 and comprises the remaining portion of the body 10 outside the volume displaced by the array of directionally solidified recrystallized regions 36.

Figure 5:
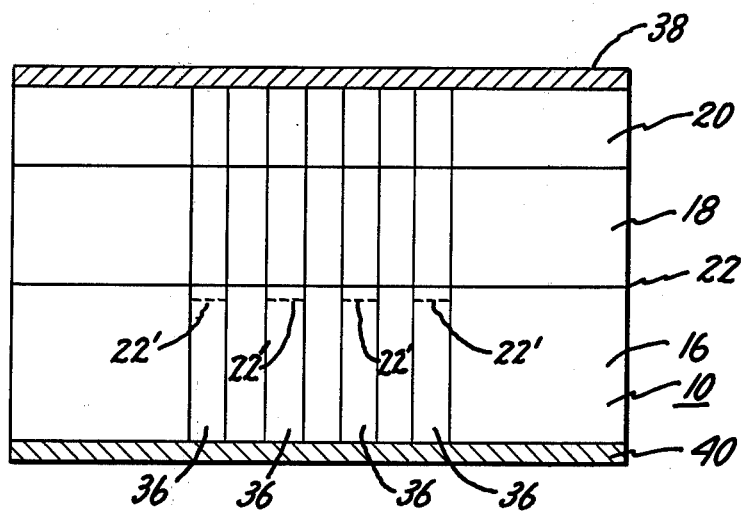

The semiconductor body 10 is further processed by removing the oxide layer 24 and remaining portions of the depressions 32 by mechanical grinding and polishing to produce the processed body 10 as shown in FIG. 5 for the device of FIG. 4 where the top surface and the opposed bottom surface are smooth, polished and planar and substantially parallel to each other. The power device is then completed by the affixing of electrodes 38 and 40 to, and in an electrically conductive relationship with, the respective top and bottom surfaces of the device.

The device as completed has superior turn-off and temperature characteristics than that of prior art devices. The plurality of columnar regions is an excellent means for controlling the minority carrier lifetime of the device. The temperature gradient zone melting process practiced herein enables one to distribute the columnar regions throughout the hottest region of the device and therefore the region of maximum current density and the maximum free carrier density of the device. Therefore, the device of this invention has a superior turn-off time and improved surface leakage capability when compared to prior art devices. The device of this invention has improved voltage and temperature ratings in comparison to prior art devices. The introduction of a minority carrier lifetime controlling material by the process of this invention does not cause substantially any of the material to precipitate at the boundaries of the diffused regions such, for example, as phosphorous diffused regions and to deplete other regions such, for example, as boron diffused regions.

The design of the columnar array of regions is such as to provide the array of regions at a distance less than a diffusion length apart from each other. Again, it is emphasized that the diffusion length involved is that as described heretofore in this specification. The free carriers between the columnar regions are able to move into the heavy recombination centers of the recrystallized regions very rapidly. In essence, therefore, the array of columnar regions functions as a uniformly doped region.

The columnar arrangement of the recrystallized regions of deep level impurities and the process for producing the same is very adaptable for controlling the minority carrier lifetime in semiconductor devices wherein mutually adjacent P-N junctions, and particularly those defining the base width of the device, are spaced preferably on the order of 40 or more microns apart. This spacing is preferred since the alloy droplet migrating through the body dissolves the material of the body at the forward end and deposites it at the same end of the droplet. Consequently, when across a P-N junction occurs, the portion of the P-N junction traversed by the droplet is displaced a distance in the same direction as the migration is occurring up to the length of the droplet. Preferably, the droplet is of the order of 10 microns or less in length and the p-n junction may be displaced up to approximately 10 microns or less. In essence, portions of the P-N junction 22 of the device of FIG. 4 which are displaced is depicted by the dash line 22. This displacement of the P-N junction is tolerable in large area power devices wherein power ratings are given with a tolerance of ± 10% of the normal power rating.

Figure 6:
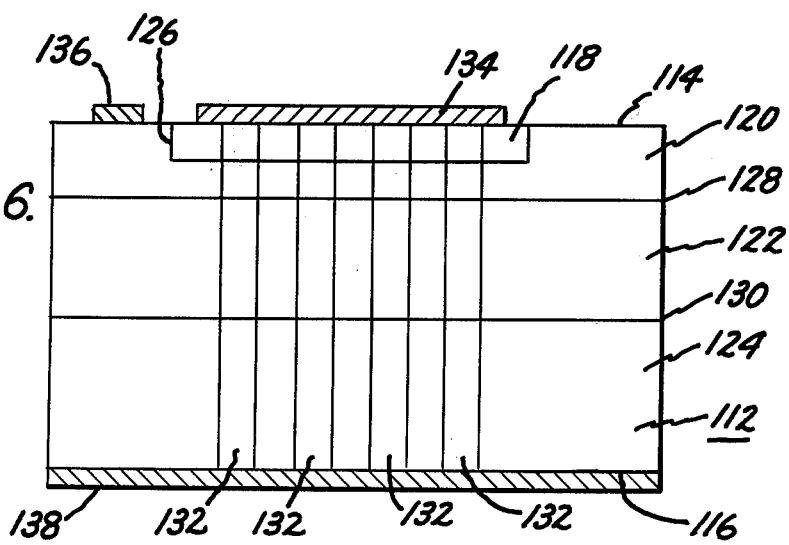
FIG. 6 is an elevation view, in cross-section, of a semiconductor device made in accordance with the teachings of this invention.

With reference to FIG. 6, there is shown a semiconductor controlled rectifier 110 made in accordance with the teachings of this invention. The device 110 comprises a body 112 of a first level of minority carrier lifetime and has top and bottom surfaces 114 and 116 which are opposed to and substantially parallel to each other. Four regions 118, 120, 122 and 124 of alternate and opposite type conductivity are formed in the body 112. P-N junctions 126, 128 and 130 are formed by the abutting surfaces of each respective pair of regions 118 and 120, 120 and 122, and 122 and 124 of opposite type conductivity.

Figure 7:
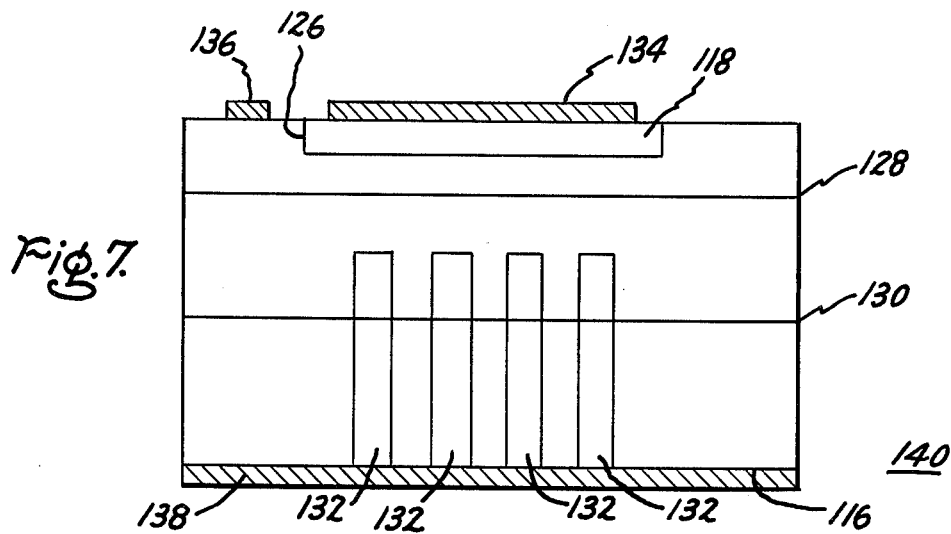
FIG. 7 is an elevation view, in cross-section, of an alternate embodiment of the device of FIG. 6.

An array of columnar regions 132 is disposed in the body 112, each region 132 being substantially perpendicular to the top and bottom surfaces 114 and 116, and substantially parallel to each other. Each region 132 is formed in the same manner as the regions 36 of the device of FIGS. 1 through 4 described heretofore, and has the same material composition and crystallographic structure as described heretofore in order to control the level of minority carrier lifetime in the device 110. The physical spacing of the regions 132 from each other and from the outer periphery of the device 110 is the same as previously described for the device of FIGS. 1 through 4. Electrical contacts 134, 136 and 138 are affixed to the respective regions 118 and 132, 120 and 124 and are in an electrical conductive relationship therewith to enable the device 110 to function as a semiconductor controlled switch when properly biased. Alternately, as required and as shown with reference to FIG. 7, the array of columnar regions 132 may, as required, be formed by migration from the bottom surface 116 a predetermined distance into the body. The regions 132 cross the P-N junction 130 and extend into the regions 122 but terminate short of the P-N junction 128. Operating functions and advantages for the device 140 are the same as described for the device of FIG. 3. In particular, it is to be noted that often regions 122 and 124 have great widths. Therefore, any displacement of the P-N junction 130 during formation of the regions 132 has an insignificant affect on the performance of the device.

Figure 8:
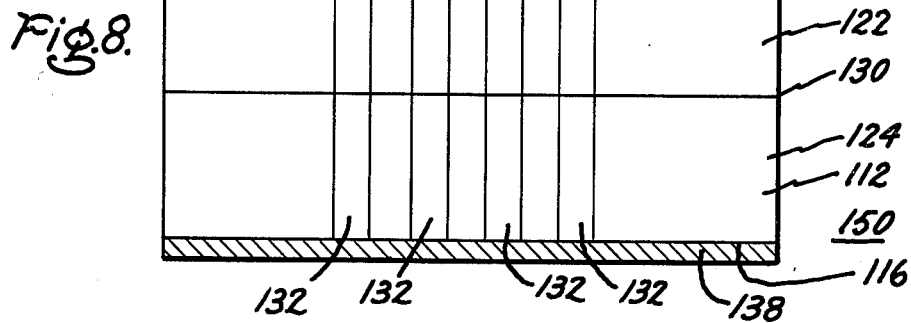
FIGS. 8 and 9 are elevation views, in cross-section, of other semiconductor devices made in accordance with the teachings of this invention.

Referring now to FIG. 8, there is shown a semiconductor controlled rectifier 150 which is an alternate embodiment of the switch 110. Those items denoted by the same reference numerals as employed in describing the switch 110 are the same as, and function in the same manner as, the item of the same reference number previously described. The switch 150 embodies a basic shorted emitter configuration wherein an electrical contact 152 is affixed to, and is in an electrically conductive relationship with, regions 118 and 120 simultaneously. It is to be noted that the array of columnar regions 132 is disposed in a manner to prevent the array from being disposed in the shorted emitter region of the device 150.

Figure 9:
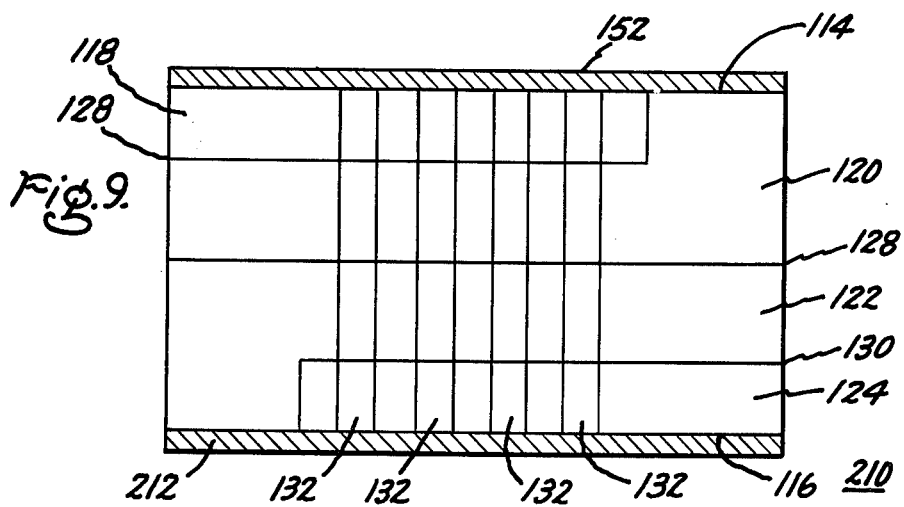

With reference to FIG. 9, there is shown a bilateral switch 210 which is an alternate embodiment of the switches 110 and 150. Those items which are denoted by the same reference numerals as employed in describing the switches 110 and 150 are the same as, and function in the same manner as, the items described heretofore. The difference in this switch 210 from other switches 110 and 150 is that an electrical contact 212 affixed to, and in one electrically conductive relationship with, regions 122 and 124 simultaneously provides a second shorted emitter configuration necessary to make the device a bilateral switch.

I claim as my invention:

1. A semiconductor device comprising:
    a body of single crystal semiconductor material having a predetermined type conductivity, a predetermined level of resistivity, a predetermined first level of lifetime, two major opposed surfaces comprising, respectively, the top and bottom surfaces thereof, and a vertical axis aligned substantially parallel with a preferrd first crystal axis of the material of the body;

at least the top surface having a preferred planar crystal orientation which is one selected from the group consisting of (111) and (100);

at least two abutting regions of alternate and opposite type conductivity formed in the body, one of the regions having a surface area coextensive with the top surface of the body, and another one of the regions having a surface area coextensive with the bottom surface of the body;

a P–N junction formed by the coextensive surfaces of the material of each pair of abutting regions of opposite type conductivity;

at least a portion of one of the P–N junctions being parallel with the two opposed major surfaces;

at least one region of recrystallized semiconductor material formed in situ in the body by the migration of a melt of metal-rich semiconductor material of each of the regions through which the melt is migrated by thermal gradient zone melting at a predetermined elevated temperature along a thermal gradient aligned substantially parallel with the preferred first crystal axis and the vertical axis of the body and having a predetermined level of concentration of the metal of the melt as determined by the solid solubility limit of that metal in that semiconductor material at that predetermined elevated temperature of migration, the metal being distributed substantially uniformly throughout the entire region, and the metal includes at least one deep level impurity material therein to impart a predetermined second level of lifetime to the region of recrystallized material and to provide recombination centers for free carriers generated within the material of the body, and each region of recrystallized semiconductor material has at least one end surface which is coextensive with one of the two major opposed surfaces and extends into the body from that surface a predetermined distance to transverse an entire region and at least a portion of a second region and intersecting that portion of at least one P–N junction which is formed between the two regions and is parallel with the opposed major surfaces.

2. The semiconductor device of claim 1 including a plurality of regions of recrystallized semiconductor material forming an array, each region being substantially perpendicular to the two opposed surfaces and parallel to each other.

3. The semiconductor device of claim 2 wherein the regions of the array are each less than one diffusion length from each adjacent region of recrystallized material of the array.

4. The semiconductor device of claim 3 wherein the impurity material is one selected from the group consisting of gold, platinum, silver and copper.

5. The semiconductor device of claim 3 wherein the outer periphery of the array is more than one diffusion length of a minority carrier from the outer periphery of the body.

6. The semiconductor device of claim 3 wherein the regions of the array traverse the entire body.

7. The semiconductor device of claim 3 wherein the material of the body is silicon, and the impurity material is gold.

8. The semiconductor device of claim 4 wherein the body has four abutting regions of alternate and opposite type conductivity and three P-N junctions, at least a portion of each P-N junction is substantially parallel with the top and bottom surfaces;

the first region is formed in the second region and each of the first and second regions has a major surface coextensive with each other and forming the top surface of the body, the end portions of the P-N junction formed by the abutting surfaces of the first and second regions of opposite type conductivity are exposed in the top surface, the recrystallized regions of the array traverse the portion of at least one of the three P-N junctions which is substantially parallel with the top and bottom surfaces.

9. The semiconductor device of claim 8 wherein the recrystallized regions of the array traverse the portion of the three P-N junctions which is substantially parallel with the top and bottom surfaces.

10. The semiconductor device of claim 9 wherein the material of the body is silicon, and the impurity material is gold.

11. The semiconductor device of claim 9 and including a first electrical contact affixed to and in electrically conductive relationship with the first region and the array of recrystallized regions;

a second electrical contact affixed to and in an electrically conductive relationship with, the second region; and a third electrical contact affixed to, and in an electrically conductive relationship with the fourth region and the array of recrystallized regions.

12. The semiconductor device of claim 9 and including a first electrical contact affixed to the top surface of the body and in electrically conductive relationship with the array of recrystallized regions, the first region, the second region and a portion of the P-N junction formed between the first and second regions exposed in the top surface of the body, and a second electrical contact affixed to the bottom surface of the body in electrically conductive relationship with the fourth region and the array of recrystallized regions.

13. The semiconductor device of claim 12 wherein the semiconductor material is silicon, and the impurity metal is gold.

14. The semiconductor device of claim 9 wherein only one end portion of the P-N junction formed between the first and second regions is exposed in the top surface, only one end portion of the P-N junction formed between the third and fourth regions is exposed in the bottom surface; and including a first electrical contact affixed to the top surface of the body and in an electrically conductive relationship with the array of recrystallized regions, the first region, the second region and the P-N junction formed between the first and second regions, and a second electrical contact affixed to the bottom surface of the body and in an electrically conductive relationship with the array of recrystallized regions, the third region, the fourth region and the P-N junction formed between the third and fourth regions.

15. The semiconductor device of claim 2 wherein the preferred planar crystal orientation is (111), and the preferred first crystal axis is < 111 >.

16. The semiconductor device of claim 15 wherein the semiconductor material is one selected from the group consisting of silicon, silicon carbide, germanium and gallium arsenide.

17. The semiconductor device of claim 16 wherein the impurity material is one selected from the group consisting of gold, platinum, silver and copper.

18. The semiconductor device of claim 17 wherein the outer periphery of the array is more than one diffusion length of a minority carrier from the outer periphery of the body.

19. The semiconductor device of claim 18 wherein the material of the body is silicon, and the impurity material is gold.

20. The semiconductor device of claim 2 wherein the preferred planar crystal orientation is (100), and the preferred first crystal axis is < 100 >.

21. The semiconductor device of claim 20 wherein the semiconductor material is one selected from the group consisting of silicon, silicon carbide, germanium and gallium arsenide.

22. The semiconductor device of claim 21 wherein the impurity material is one selected from the group consisting of gold, platinum, silver and copper.

23. The semiconductor device of claim 22 wherein the outer periphery of the array is more than one diffusion length of a minority carrier from the outer periphery of the body.

24. The semiconductor device of claim 23 wherein the material of the body is silicon, and the impurity material is gold.

* * * * *